US006903259B2

(12) United States Patent
Ciray et al.

(10) Patent No.: US 6,903,259 B2
(45) Date of Patent: Jun. 7, 2005

(54) THERMOELECTRIC DEVICE FOR USE WITH FUEL REFORMER AND ASSOCIATED METHOD

(75) Inventors: Mehmet S. Ciray, Greenwood, IN (US); Rodney H. Cain, Swartz Creek, MI (US); William Taylor, III, Columbus, IN (US); Rudolf M. Smaling, Bedford, MA (US)

(73) Assignee: Arvin Technologies, Inc., Troy, MI (US)

( * ) Notice: Subject to any disclaimer, the term of this patent is extended or adjusted under 35 U.S.C. 154(b) by 223 days.

(21) Appl. No.: 10/313,163

(22) Filed: Dec. 6, 2002

(65) Prior Publication Data

US 2004/0107987 A1 Jun. 10, 2004

(51) Int. Cl.[7] .......................... H01L 35/00; H01L 35/02; C01B 3/34; H01M 8/04
(52) U.S. Cl. ....................... 136/205; 136/200; 136/208; 136/201; 180/2.1; 429/7; 429/13; 429/21; 123/3; 48/127.9
(58) Field of Search ................................. 136/205, 200, 136/208, 201; 180/2.1; 429/13, 21, 7; 123/3; 48/127.9

(56) References Cited

U.S. PATENT DOCUMENTS

| | | |
|---|---|---|
| 4,645,521 A | 2/1987 | Freesh |
| 5,143,025 A | 9/1992 | Munday |
| 5,159,900 A | 11/1992 | Damman |
| 5,205,912 A | 4/1993 | Murphy |
| 5,207,185 A | 5/1993 | Greiner et al. |
| 5,212,431 A | 5/1993 | Origuchi et al. |
| 5,228,529 A | 7/1993 | Rosner |
| 5,272,871 A | 12/1993 | Oshima et al. |
| 5,284,503 A | 2/1994 | Bitler et al. |
| 5,293,743 A | 3/1994 | Usleman et al. |
| 5,317,996 A | 6/1994 | Lansing |
| 5,362,939 A | 11/1994 | Hanus et al. |
| 5,409,784 A | * 4/1995 | Bromberg et al. ............ 429/13 |
| 5,409,785 A | 4/1995 | Nakano et al. |
| 5,412,946 A | 5/1995 | Oshima et al. |

(Continued)

FOREIGN PATENT DOCUMENTS

| | | |
|---|---|---|
| DE | 30 48 540 | 7/1982 |
| DE | 237120 A1 | 7/1986 |
| DE | 195 10 804 | 9/1996 |
| DE | 19644864 | 5/1998 |
| DE | 197 57 936 | 7/1999 |
| DE | 19927518 | 1/2001 |
| EP | 0096538 | 12/1983 |
| EP | 0153116 | 8/1985 |
| EP | 0485922 A1 | 5/1992 |
| EP | 1030395 | 8/2000 |

(Continued)

OTHER PUBLICATIONS

HZ–14 Product Brochure from Hi–Z Technology, Inc. (printed from Internet on Aug. 14, 2002).
Jahn, "Physics of Electric Propulsion", pp. 126–130 (1968).
Belogub et al., "Petrol–Hydrogen Truck With Load–Carrying Capacity 5 Tons", Int. J. Hydrogen Energy, vol. 16, No. 6, pp. 423–426 (1991).

(Continued)

*Primary Examiner*—Alan Diamond
(74) *Attorney, Agent, or Firm*—Barnes & Thornburg LLP

(57) ABSTRACT

A fuel reforming system comprises a fuel reformer and a thermoelectric device positioned in thermal communication with the fuel reformer. A method of generating electrical energy is also disclosed.

18 Claims, 4 Drawing Sheets

U.S. PATENT DOCUMENTS

| | | | |
|---|---|---|---|
| 5,425,332 | A | 6/1995 | Rabinovich et al. |
| 5,437,250 | A | 8/1995 | Rabinovich et al. |
| 5,441,401 | A | 8/1995 | Yamaguro et al. |
| 5,445,841 | A | 8/1995 | Arendt et al. |
| 5,451,740 | A | 9/1995 | Hanus et al. |
| 5,554,819 | A * | 9/1996 | Baghai-Kermani ......... 136/206 |
| 5,560,890 | A | 10/1996 | Berman et al. |
| 5,599,758 | A | 2/1997 | Guth et al. |
| 5,660,602 | A | 8/1997 | Collier, Jr. et al. |
| 5,666,923 | A | 9/1997 | Collier, Jr. et al. |
| 5,753,383 | A * | 5/1998 | Cargnelli et al. ............. 429/13 |
| 5,787,864 | A | 8/1998 | Collier, Jr. et al. |
| 5,813,222 | A | 9/1998 | Appleby |
| 5,826,548 | A | 10/1998 | Richardson, Jr. |
| 5,845,485 | A | 12/1998 | Murphy et al. |
| 5,847,353 | A | 12/1998 | Titus et al. |
| 5,852,927 | A | 12/1998 | Cohn et al. |
| 5,887,554 | A | 3/1999 | Cohn et al. |
| 5,894,725 | A | 4/1999 | Cullen et al. |
| 5,910,097 | A | 6/1999 | Boegner et al. |
| 5,921,076 | A | 7/1999 | Krutzsch et al. |
| 5,974,791 | A | 11/1999 | Hirota et al. |
| 6,012,326 | A | 1/2000 | Raybone et al. |
| 6,014,593 | A | 1/2000 | Grufman |
| 6,047,543 | A | 4/2000 | Caren et al. |
| 6,048,500 | A | 4/2000 | Caren et al. |
| 6,082,102 | A | 7/2000 | Wissler et al. |
| 6,122,909 | A | 9/2000 | Murphy et al. |
| 6,125,629 | A | 10/2000 | Patchett |
| 6,130,260 | A | 10/2000 | Hall et al. |
| 6,134,882 | A | 10/2000 | Huynh et al. |
| 6,152,118 | A | 11/2000 | Sasaki et al. |
| 6,176,078 | B1 | 1/2001 | Balko et al. |
| 6,235,254 | B1 | 5/2001 | Murphy et al. |
| 6,245,309 | B1 * | 6/2001 | Etievant et al. ............. 423/248 |
| 6,248,684 | B1 | 6/2001 | Yavuz et al. |
| 6,284,157 | B1 | 9/2001 | Eliasson et al. |
| 6,311,232 | B1 | 10/2001 | Cagle et al. |
| 6,322,757 | B1 | 11/2001 | Cohn et al. |
| 6,458,478 | B1 * | 10/2002 | Wang et al. ................... 429/17 |
| 6,651,597 | B2 * | 11/2003 | Daniel et al. ................... 123/3 |
| 2002/0194835 | A1 * | 12/2002 | Bromberg et al. ............. 60/275 |
| 2003/0047146 | A1 * | 3/2003 | Daniel et al. ................... 123/3 |
| 2003/0047147 | A1 * | 3/2003 | Daniel et al. ................... 123/3 |
| 2004/0101750 | A1 * | 5/2004 | Burch ........................ 429/200 |
| 2004/0216378 | A1 * | 11/2004 | Smaling .................... 48/198.7 |

FOREIGN PATENT DOCUMENTS

| | | | |
|---|---|---|---|
| EP | 1057998 | | 12/2000 |
| FR | 2593493 | | 7/1987 |
| FR | 2620436 | | 3/1989 |
| GB | 355210 | | 2/1930 |
| GB | 1221317 | | 2/1971 |
| GB | 2241746 | | 9/1991 |
| JP | 51 27630 | | 8/1976 |
| JP | 02 121300 | | 5/1990 |
| JP | 03195305 | | 8/1991 |
| JP | 05 231242 | | 9/1993 |
| JP | 07 292372 | | 11/1995 |
| JP | 10-167701 | A * | 6/1998 |
| JP | 2001-192675 | A * | 7/2001 |
| JP | 2002-358997 | A * | 12/2002 |
| SU | 1519762 | | 11/1989 |
| WO | WO 85/00159 | | 1/1985 |
| WO | WO 94/03263 | | 2/1994 |
| WO | WO 95/06194 | | 3/1995 |
| WO | WO 96/24441 | | 8/1996 |
| WO | WO 98/45582 | | 10/1998 |
| WO | WO 00/26518 | | 5/2000 |
| WO | WO 01/14698 A1 | | 3/2001 |
| WO | WO 01/14702 A1 | | 3/2001 |
| WO | WO 01/33056 A1 | | 5/2001 |

OTHER PUBLICATIONS

Breshears et al., "Partial Hydrogen Injection Into Internal Combustion Engines", Proceedings of the EPA $1^{st}$ Symposium on Low Pollution Power Systems and Development, Ann Arbor, MI, pp. 268–277 (Oct. 1973).

Chuveliov et al., "Comparison of Alternative Energy Technologies Utilizing Fossil Fuels and Hydrogen Based on Their Damage to Population and Environment in the USSR and East Europe", pp. 269–300, date unknown.

Correa, "Lean Premixed Combustion for Gas–Turbines: Review and Required Research", PD–vol. 33, Fossile Fuel Combustion, ASME, pp. 1–9 (1991).

Czernichowski et al., "Multi–Electrodes High Pressure Gliding Discharge Reactor and its Applications for Some Waste Gas and Vapor Incineration", Proceedings of Workshop on Plasma Destruction of Wastes, France, pp. 1–13 (1990).

Das, "Exhaust Emission Characterization of Hydrogen–Operated Engine System: Nature of Pollutants and their Control Techniques", Int. J. Hydrogen Energy, vol. 16, No. 11, pp. 765–775 (1991).

Das, "Hydrogen Engines: A View of the Past and a Look into the Future", Int. J. of Hydrogen Energy, vol. 15, No. 6, pp. 425–443 (1990).

Das, "Fuel Induction Techniques for a Hydrogen Operated Engine", Int. J. of Hydrogen Energy, vol. 15, No. 11 (1990).

DeLuchi, "Hydrogen Vehicles: An Evaluation of Fuel Storage, Performance, Safety, Environmental Implants and Costs", Int. J. Hydrogen Energy, vol. 14, No. 2, pp. 81–130 (1989).

Duclos et al., "Diagnostic Studies of a Pinch Plasma Accelerator", AIAA Journal, vol. 1, No. 11, pp. 2505–2513 (Nov. 1963).

Feucht et al., "Hydrogen Drive for Road Vehicles—Results from the Fleet Test Run in Berlin", Int. J. Hydrogen Energy, vol. 13, No. 4, pp. 243–250 (1988).

Finegold et al., "Dissociated Methanol as a Consumable Hydride for Automobiles and Gas Turbines", pp. 1359–1369, Advances in Hydrogen Energy 3 (Jun. 13–17, 1982).

Hall et al., "Initial Studies of a New Type of Ignitor: The Railplug"—SAE Paper 912319, pp. 1730–1746 (1991).

Houseman et al., "Hydrogen Engines Based On Liquid Fuels, A Review", G.E., Proc., $3^{rd}$ World Hydrogen Energy Conf., pp. 949–968 (1980).

Houseman, et al., "Two Stage Combustion for Low Emissions Without Catalytic Converters", Proc. of Automobile Engineering Meeting, Dearborn, MI, pp. 1–9 (Oct. 18–22, 1976).

Jones, et al., "Exhaust Gas Reforming of Hydrocarbon Fuels", Soc. of Automotive Engineers, Paper 931086, pp. 223–234 (1993).

Kaske et al., "Hydrogen Production by the Hüls Plasma–Reforming Process", Proc. VI World Hydrogen Energy Conference, vol. 1, pp. 185–190 (1986).

MacDonald, "Evaluation of Hydrogen–Supplemented Fuel Concept with an Experimental Multi–Cylinder Engine", Society of Automotive Engineers, Paper 760101, pp. 1–16 (1976).

Mackay, "Development of a 24 kW Gas Turbine–Driven Generator Set for Hybrid Vehicles", 940510, pp. 99–105, NoMac Energy Systems, Inc., date unknown.

Mackay, "Hybrid Vehicle Gas Turbines", 930044, pp. 35–41, NoMac Energy Systems, Inc., date unknown.

Matthews et al., "Further Analysis of Railplugs as a New Type of Ignitor", SAE Paper 922167, pp. 1851–1862 (1992).

Mishchenko et al., "Hydrogen as a Fuel for Road Vehicles", Proc. VII World Hydrogen Energy Conference, vol. 3, pp. 2037–2056 (1988).

Monroe et al., "Evaluation of a Cu/Zeolite Catalyst to Remove $NO_x$ from Lean Exhaust", Society of Automotive Engineers, Paper 930737, pp. 195–203 (1993).

Rabinovich et al., "On Board Plasmatron Generation of Hydrogen Rich Gas for Engine Pollution Reduction", Proceedings of NIST Workshop on Advanced Components for Electric and Hybrid Electric Vehicles, Gaithersburg, MD, pp. 83–88 (Oct. 1993) (not published).

Rabinovich et al., "Plasmatron Internal Combustion Engine System for Vehicle Pollution Reduction", Int. J. of Vehicle Design, vol. 15, Nos. 3/4/5, pp. 234–242 (1994).

Scott et al., "Hydrogen Fuel Breakthrough with On–Demand Gas Generator", 372 Automotive Engineering, vol. 93, No. 8, Warrendale, PA, U.S.A., pp. 81–84 (Aug. 1985).

Shabalina et al., "Slag Cleaning by Use of Plasma Heating", pp. 1–7, date unknown.

Handbook of Thermodynamic High Temperature Process Data, pp. 507–547, date unknown.

Varde et al., "Reduction of Soot in Diesel Combustion with Hydrogen and Different H/C Gaseous Fuels", Hydrogen Energy Progress V, pp. 1631–1639, date unknown.

Wang et al., "Emission Control Cost Effectiveness of Alternative–Fuel Vehicles", Society of Automotive Engineers, Paper 931786, pp. 91–122 (1993).

Wilson, "Turbine Cars", Technology Review, pp. 50–56 (Feb./Mar., 1995).

Tachtler, "Fuel Cell Auxillary Power Unit—Innovation for the Electric Supply of Passenger Cars?", Society of Automotive Engineers, Paper No. 2000–01–0374, pp. 109–117 (2000).

Kirwan, "Fast Start–Up On–Board Gasoline Reformer for Near Zero Emissions in Spark–Ignition Engines", Society of Automotive Engineers World Congress, Detroit, MI (Mar. 4–7, 2002), Paper No. 2002–01–1011.

Bromberg, "Emissions Reductions Using Hydrogen from Plasmatron Fuel Converters", Int. J. of Hydrogen Energy 26, pp. 1115–1121 (2001).

Bromberg, "Experimental Evaluation of SI Engine Operation Supplemented by Hydrogen Rich Gas from a Compact Plasma Boosted Reformer", Massachusetts Institute of Technology Plasma Science and Fusion Center Report, JA–99–32 (1999).

Bromberg, "Compact Plasmatron–Boosted Hydrogen Generation Technology for Vehicular Applications", Int. J. of Hydrogen Energy 24, pp 341–350 (1999).

Gore, "Hydrogen A Go–Go", Discover, p. 92–93, (Jul., 1999).

Burch, "An Investigation of the $NO/H_2/O_2$ Reaction on Noble–Metal Catalyst at Low Temperatures Under Lean–Burn Conditions," Journal of Applied Catalysis B: Environmental 23, pp. 115–121 (1999).

Costa, "An Investigation of the $NO/H_2/O_2$ (Lean De–$No_x$) Reaction on a Highly Active and Selective $Pt/La_{0.7}Sr_{0.2}Ce_{0.1}FeO_3$ Catalyst at Low Temperatures", Journal of Catalysis 209, pp. 456–471 (2002).

Kirwan, "Development of a Fast Start–up O Gasoline Reformer for Near Zero Spark–Ignition Engines", Delphi Automotive Systems, pp. 1–21 (2002).

Shelef, "Twenty–five Years after Introduction of Automotive Catalysts: What Next?" Journal of Catalysis Today 62, pp. 35–50 (2000).

Koebel, "Selective Catalytic Reduction on NO and $NO_2$ at Low Temperatures", Journal of Catalysis Today 73, pp. 239–247 (2002).

Frank, "Kinetics and Mechanism of the Reduction of Nitric Oxides by $H_2$ Under Lean–Burn Conditions on a Pt–Mo–Co/ $\alpha Al_2O_3$ Catalyst", Journal of Applied Catalysis B: Environmental 19, pp. 45–57 (1998).

Nanba, "Product Analysis of Selective Catalytic Reduction of $NO_2$ with $C_2H_4$ Over H–Ferrierite", Journal of Catalysis 211, pp. 53–63 (2002).

Simanaitis, "Whither the Automobile?", Road and Track, pp. 98–102 (Sep. 2001).

Stokes, "A Gasoline Engine Concept for Improved Fuel Economy—The Lean Boost System", International Falls Fuels and Lubricants Meeting and Exposition, Baltimore, MD, SAE Technical Paper Series, 14 pages (Oct. 16–19, 2000).

Chandler, "Device May Spark Clean–Running Cars", The Boston Globe, p. E1 (Jul. 12, 1999).

* cited by examiner

THERMOELECTRIC DEVICE FOR USE WITH FUEL REFORMER AND ASSOCIATED METHOD

FIELD OF THE DISCLOSURE

The present disclosure relates generally to fuel reformers and systems and methods associated therewith.

BACKGROUND OF THE DISCLOSURE

Plasma fuel reformers reform hydrocarbon fuel into a reformate gas such as hydrogen-rich gas. In the case of an onboard plasma fuel reformer of a vehicle or stationary power generator, the reformate gas produced by the reformer may be utilized as fuel or fuel additive in the operation of an internal combustion engine. The reformate gas may also be utilized to regenerate or otherwise condition an emission abatement device associated with the internal combustion engine or as a fuel for a fuel cell.

SUMMARY OF THE DISCLOSURE

According to one aspect of the disclosure, a fuel reforming system includes a fuel reformer and a thermoelectric device. The thermoelectric device is positioned in thermal communication with the fuel reformer.

According to another aspect of the disclosure, the fuel reformer comprises a plasma fuel reformer operable to reform a fuel to produce a reformate gas. The thermoelectric device converts heat energy generated by operation of the plasma fuel reformer to electrical energy.

According to another aspect of the disclosure, a method of generating electrical energy includes the steps of operating a fuel reformer to reform a fuel to produce a reformate gas and converting heat energy generated by operation of the fuel reformer to electrical energy.

The above and other features of the present disclosure will become apparent from the following description and the attached drawings.

DETAILED DESCRIPTION OF THE DRAWINGS

Figure 1:
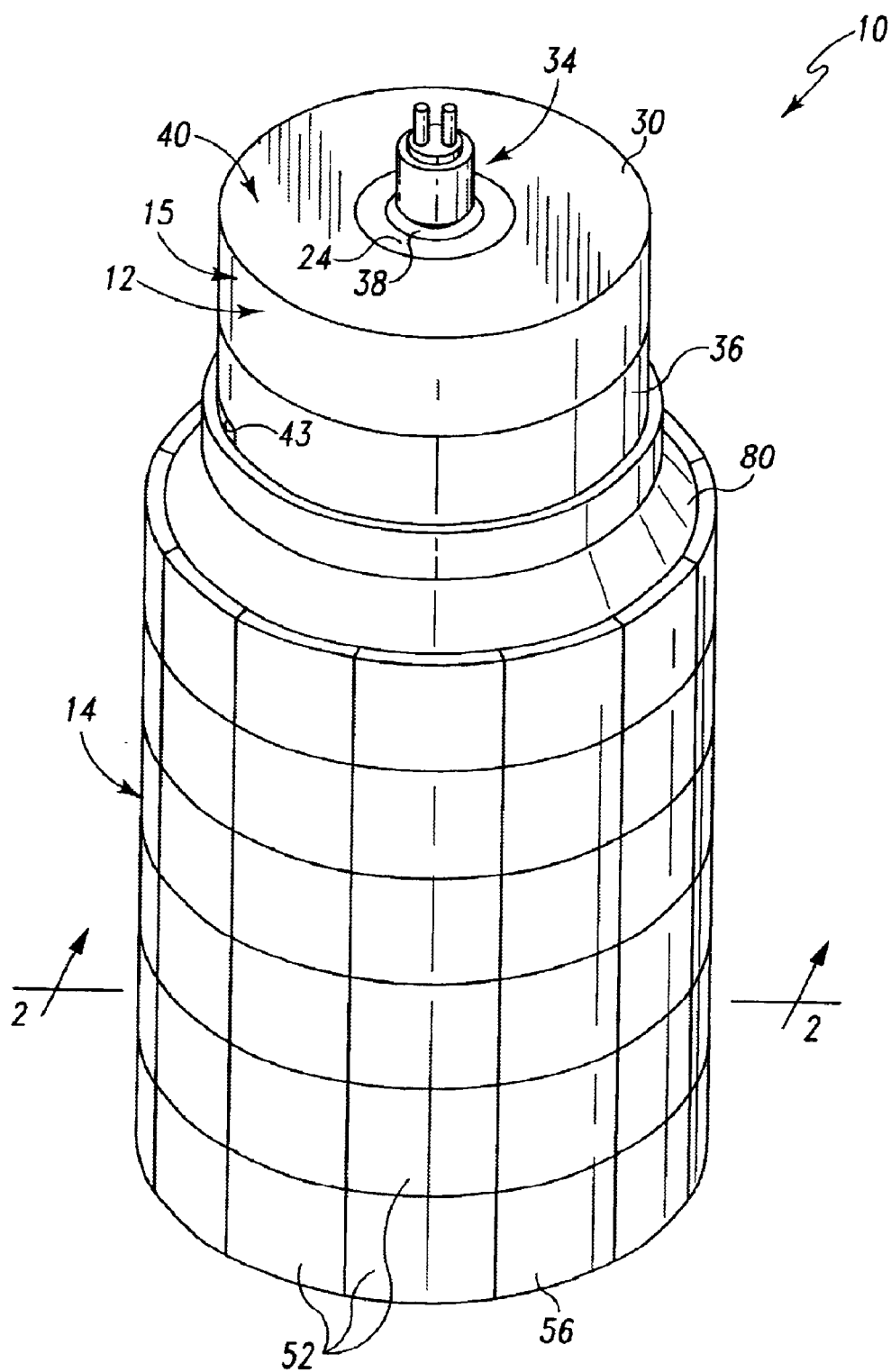
FIG. 1 is a perspective view showing a thermoelectric device around a fuel reformer.

While the concepts of the present disclosure are susceptible to various modifications and alternative forms, specific exemplary embodiments thereof have been shown by way of example in the drawings and will herein be described in detail. It should be understood, however, that there is no intent to limit the disclosure to the particular forms disclosed, but on the contrary, the intention is to cover all modifications, equivalents, and alternatives following within the spirit and scope of the invention as defined by the appended claims.

Figure 2:
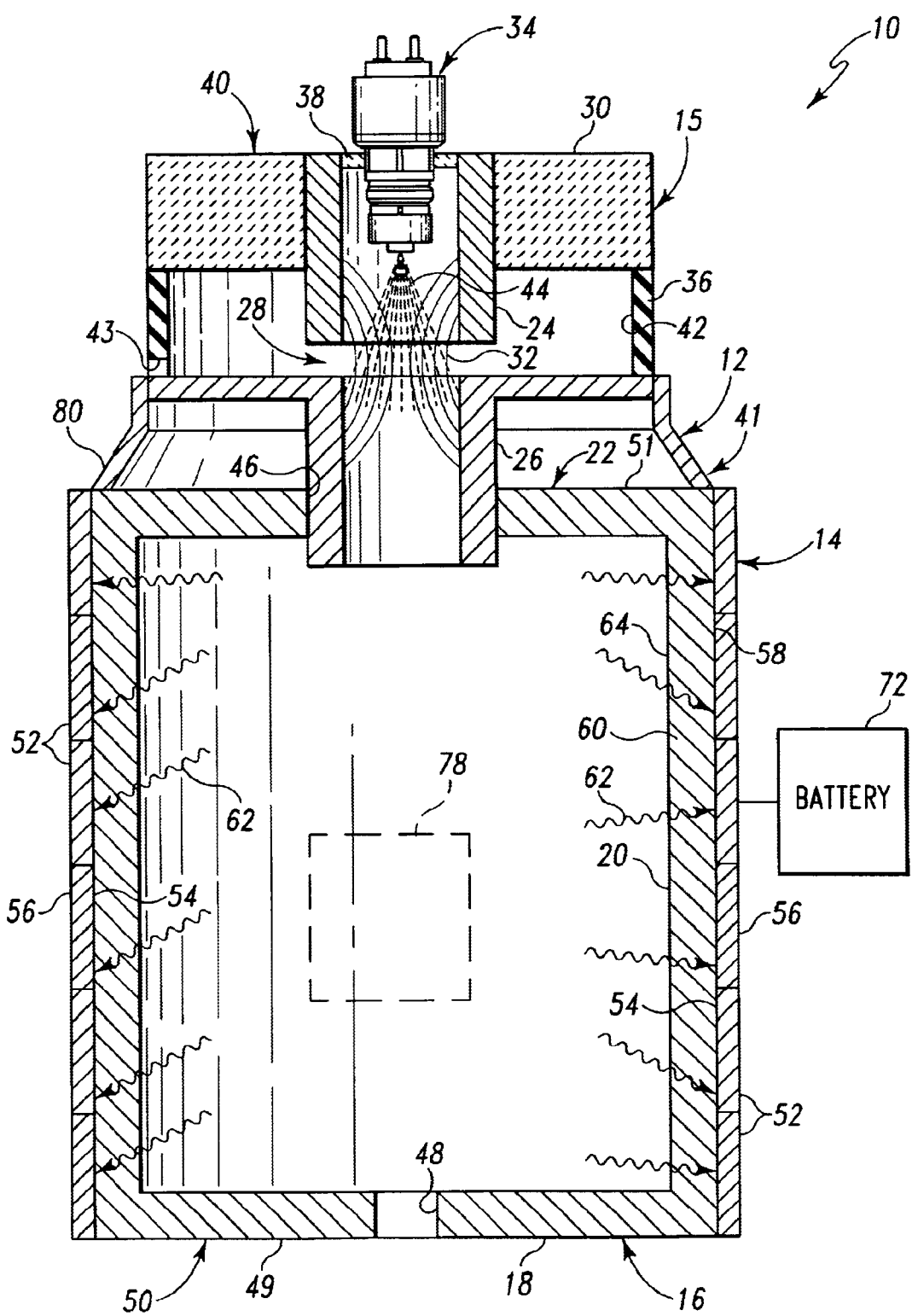
FIG. 2 is a sectional view taken along line 2—2 of FIG. 1 showing the fuel reformer, the thermoelectric device, and a battery electrically coupled to the thermoelectric device to receive electrical energy from the thermoelectric device (note that the fuel injector of the fuel reformer is not shown in cross section for clarity of description)

Referring now to FIGS. 1 and 2, there is shown a fuel reforming system 10. The fuel reforming system 10 includes a fuel reformer 12 and a thermoelectric device 14 positioned in thermal communication with the fuel reformer 12. The fuel reformer 12 is operable to reform a fuel to produce a reformate gas and generates heat energy when it operates. The thermoelectric device 14 converts heat energy generated by operation of the fuel reformer 12 to electrical energy.

The fuel reformer 12 is embodied as a plasma fuel reformer which uses a plasma—an electrically heated gas— to convert hydrocarbon fuel into a reformats gas such as a hydrogen-rich gas. Systems including plasma fuel reformers are disclosed in U.S. Pat. No. 5,425,332 issued to Rabinovich et al.; U.S. Pat. No. 5,437,250 issued to Rabinovich et al.; U.S. Pat. No. 5,409,784 issued to Bromberg et al.; and U.S. Pat. No. 5,887,554 issued to Cohn, et al., the disclosures of which are hereby incorporated by reference herein. The fuel reformer 12 may be embodied as another type of fuel reformer such as a catalytic fuel reformer, a thermal fuel reformer, or a steam fuel reformer.

Hydrogen-rich gas generated by the fuel reformer 12 may be supplied to an internal combustion engine (not shown) such as a spark-ignited gasoline engine. In such a case, the internal combustion engine combusts the reformate gas as either the sole source of fuel, or alternatively, as a fuel additive to a hydrocarbon fuel. Alternatively, hydrogen-rich gas generated by the fuel reformer 12 may be supplied to a fuel cell (not shown) such as an alkaline fuel cell (AFC), a phosphoric acid fuel cell (PAFC), a proton exchange membrane fuel cell (PEMFC), a solid oxide fuel cell (SOFC), a molten carbonate fuel cell (MCFC), or any other type of fuel cell. In such a case, the fuel cell utilizes the hydrogen-rich gas in the production of electrical energy. The hydrogen-rich gas from the fuel reformer 12 may also be supplied to an emission abatement device such as a NOx trap or a soot filter to facilitate regeneration thereof.

The fuel reformer 12 includes a plasma generator 15 and a reactor 16, as shown in FIG. 2. The reactor 16 includes a reactor housing 18 having a reaction chamber 20 defined therein. The plasma generator 15 is secured to an upper wall 22 of the reactor housing 18. Specifically, the plasma generator 15 includes an upper electrode 24 and a lower electrode 26. The electrodes 24, 26 are spaced apart from one another so as to define an electrode gap 28 therebetween. An insulator 30 electrically insulates the electrodes from one another. Collectively, portions of the electrodes 24, 26, the insulator 30, a gasket 36, a cap 38, and a support 80 define a plasma housing 40. The plasma housing 40 and the reactor housing 18 cooperate to define a housing 41 of the fuel reformer 12.

The electrodes 24, 26 are electrically coupled to an electrical power supply (see FIG. 4) such that, when energized, a plasma arc 32 is created across the electrode gap 28 (i.e., between the electrodes 24, 26). A fuel input mechanism such as fuel injector 34 injects a hydrocarbon fuel 44 into the plasma arc 32. The fuel injector 34 may be any type of fuel injection mechanism which produces a desired mixture of fuel and air and thereafter injects such a mixture into the plasma housing 40. In certain configurations, it may be desirable to atomize the fuel mixture prior to, or during, injection of the mixture into the plasma housing 40. Such fuel injector assemblies (i.e., injectors which atomize the fuel mixture) are commercially available.

As shown in FIG. 2, the configuration of the plasma housing 40 defines an annular air chamber 42. Pressurized air enters the air chamber 42 through an air inlet 43 and is directed radially inwardly through the electrode gap 28 so as to "bend" the plasma arc 32 inwardly. Such bending of the plasma arc 32 ensures that the injected fuel 44 is directed through the plasma arc 32. Such bending of the plasma arc 32 also reduces erosion of the electrodes 22, 24.

As shown in FIG. 2, the lower electrode 26 extends downwardly through a reactor air inlet 46 defined in the reactor housing 18. As such, reformate gas (or partially reformed gas) exiting the plasma arc 32 is advanced into the reaction chamber 20. One or more catalysts 78 are positioned in the reaction chamber 20. The catalysts 78 complete the fuel reforming process, or otherwise treat the reformate gas, prior to exit of the reformate gas through a gas outlet 48.

The aforedescribed configuration of the fuel reformer 12 is exemplary in nature, with numerous other configurations of the fuel reformer 12 being contemplated for use in regard to the present disclosure.

The thermoelectric device 14 is positioned around a portion of the periphery of the housing 41, as shown in FIGS. 1–2. Specifically, the thermoelectric device 14 is configured as a sleeve that surrounds the reactor housing 18 and extends from a downwardly facing surface 49 of a lower wall 50 of the reactor housing 18 to an upwardly facing surface 51 of the upper wall 22 of the reactor housing 18. It should be appreciated that the configuration of the thermoelectric device depicted in FIGS. 1–2 is exemplary in nature and that other configurations of the thermoelectric device are contemplated for use. For example, the thermoelectric device 14 may be extended so as to cover at least a portion of the downwardly facing surface 49. The thermoelectric device 14 may also be extended so as to cover at least a portion of the support 80 of the plasma generator 15 or other portions of the plasma generator 15. The thermoelectric device 14 may also be configured to more closely or less closely "conform" to the outer shape of the reactor housing 18 or the components of the plasma generator 15.

The thermoelectric device 14 includes a plurality of thermoelectric modules 52, as shown in FIGS. 1–2. Each thermoelectric module 52 is configured to convert heat energy into electrical energy when a temperature differential is generated across it. The thermoelectric modules 52 collectively define the sleeve of the thermoelectric device 14. The thermoelectric modules 52 may be bismuth telluride thermoelectric modules, quantum well thermoelectric modules, and/or other types of thermoelectric modules. For example, any of models HZ-2, HZ-9, HZ-14, and HZ-20 from Hi-Z Technology, Inc., which is located in San Diego, Calif., may be used for thermoelectric modules 52.

The thermoelectric device 14 includes an inner surface 54 and an outer surface 56, as shown in FIG. 2. The inner surface 54 contacts and surrounds an outer surface 58 of a side wall 60 of reactor housing 18 for thermal communication therewith.

A temperature differential across the thermoelectric device 14 causes the thermoelectric device 14 to produce electrical energy. Specifically, the thermoelectric device 14 converts heat energy to electrical energy when the temperature of the inner surface 54 of the thermoelectric device 14 is higher than the temperature of the outer surface 56 of the thermoelectric device 14. This temperature differential is generated during operation of the fuel reformer 12.

Operation of the fuel reformer 12 generates heat energy in the reaction chamber 20. At least some of this heat energy (indicated by wavy lines 62 in FIG. 2) is transmitted through the side wall 60 from an inner surface 64 of the side wall 60 to the outer surface 58 of the side wall 60 and to the inner surface 54 of the thermoelectric device 14 to heat the inner surface 54. At the same time, the outer surface 56 is maintained at a temperature lower than the temperature of the inner surface 54 to establish the temperature differential between the inner surface 54 and the outer surface 56. There are a variety of ways that the outer surface 56 may be maintained at a temperature lower than the temperature of the inner surface 54. For example, the outer surface 56 may be cooled by a flow of air, water, or other fluid past the outer surface 56. A pump, blower, fan, or other fluid source may be used to provide this cooling flow. A casing may be added around the outer surface 56 to provide an air gap between the outer surface 56 and the casing for air to flow therethrough past the outer surface 56. In addition, the outer surface 56 may be cooled by ambient air as the vehicle to which the fuel reforming system 10 may be mounted is driven. In short, all ways for establishing the outer surface 56 at a lower temperature than the inner surface 54 so as to generate a temperature differential therebetween is within the scope of this disclosure.

Figure 3:
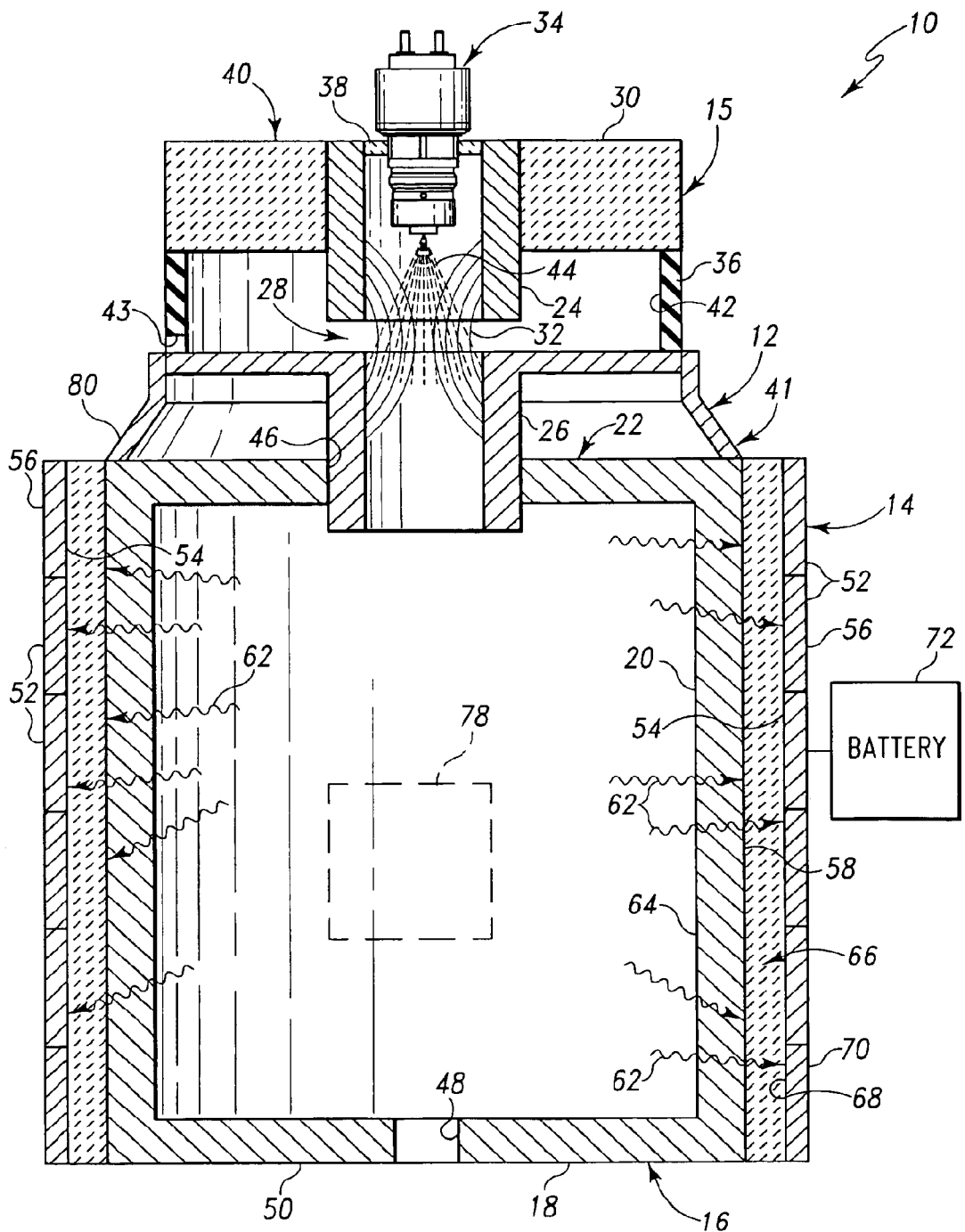
FIG. 3 is a sectional view similar to FIG. 2 showing thermal insulation positioned between the fuel reformer and the thermoelectric device.

Referring now to FIG. 3, in some embodiments the fuel reforming system 10 includes thermal insulation 66. The thermal insulation 66 is positioned between the housing 41 of the fuel reformer 12 and the thermoelectric device 14 to block transmission of some heat energy generated during operation of the fuel reformer 12 to the inner surface 54 of the thermoelectric device 14. Specifically, the thermal insulation 66 is positioned around a portion of the periphery of the reactor housing 18. The thermal insulation 66 is configured, for example, as a sleeve that surrounds the reactor housing 18 and is itself surrounded by the thermoelectric device 14.

The thermal insulation 66 includes an inner surface 68 and an outer surface 70. The inner surface 68 of the thermal insulation 66 contacts the outer surface 58 of the side wall 60. The outer surface 70 of the thermal insulation contacts the inner surface 54 of the thermoelectric device 14.

Figure 4:
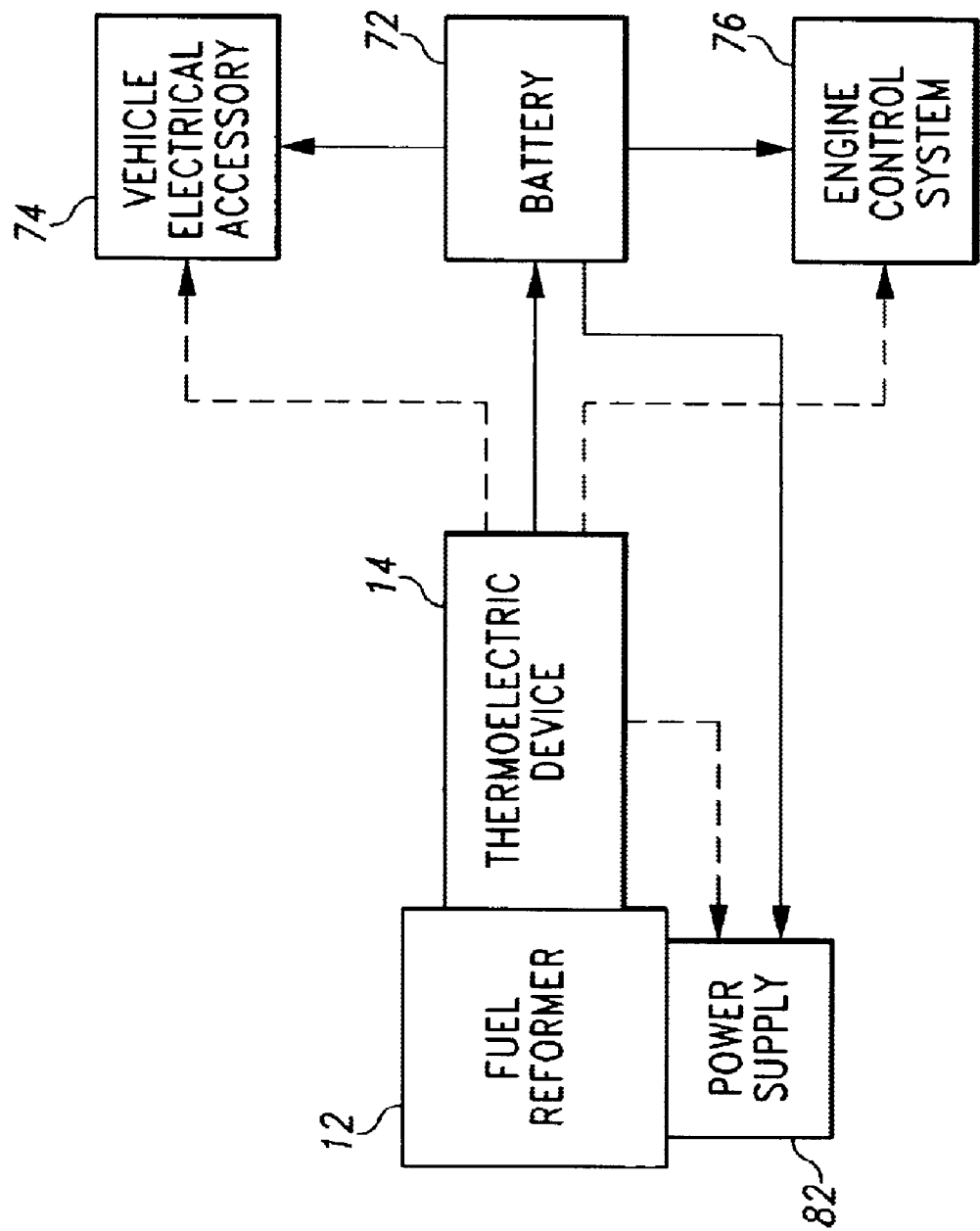
FIG. 4 is a simplified block diagram showing in solid lines the battery supplying electrical energy received from the thermoelectric device to a vehicle electrical accessory, an engine control system, and a power supply electrically coupled to the fuel reformer and showing in dotted lines the thermoelectric device supplying electrical energy directly to the vehicle electrical accessory, the engine control system, and the power supply without being routed through the battery.

Referring now to FIG. 4, the electrical energy produced by the thermoelectric device 14 during operation of the fuel reformer 12 is supplied, for example, to an electrical energy storage device such as a battery 72 (see also FIGS. 2–3). The battery 72 stores the electrical energy supplied by the thermoelectric device 14 and is electrically coupled to an electrical accessory 74 of a vehicle, an engine control system 76 configured to control the engine of the vehicle, and a power supply 82 to supply electrical energy to the fuel reformer 12. The battery 72 supplies electrical energy received from the thermoelectric device 14 to the electrical accessory 74, the engine control system 76, and the power supply 82. In some embodiments, the thermoelectric device 14 is electrically coupled directly to the electrical accessory 74, the engine control system 76, and the power supply 82, as suggested by the dotted lines of FIG. 4, to supply electrical energy directly thereto without being routed through the battery 72. It should be appreciated that the electrical energy generated by the thermoelectric device 14 may be used for a wide variety of applications.

While the disclosure has been illustrated and described in detail in the drawings and foregoing description, such an illustration and description is to be considered as exemplary and not restrictive in character, it being understood that only illustrative embodiments have been shown and described and that all changes and modifications that come within the spirit of the disclosure are desired to be protected.

There are a plurality of advantages of the present disclosure arising from the various features of the apparatus, method, and system described herein. It will be noted that alternative embodiments of the present disclosure may not include all of the features described yet still benefit from at least some of the advantages of such features. Those of ordinary skill in the art may readily devise their own implementations of an apparatus, method, and system that incorporate one or more of the features of the present disclosure and fall within the spirit and scope of the present invention as defined by the appended claims.

What is claimed is:

1. A fuel reforming system, comprising:
   a fuel reformer; and
   a thermoelectric device which convert heat energy to electrical energy positioned in thermal communication with the fuel reformer. wherein the fuel reformer comprises a plasma fuel reformer.

2. The fuel reforming system of claim 1, wherein the thermoelectric device converts heat energy to electrical energy during operation of the fuel reformer.

3. The fuel reforming system of claim 1, wherein the fuel reformer comprises a housing, and the thermoelectric device is positioned around a portion of the periphery of the housing.

4. The fuel reforming system of claim 3, wherein the thermoelectric device comprises a plurality of thermoelectric modules positioned around the portion of the periphery of the housing.

5. The fuel reforming system of claim 1, further comprising thermal insulation, wherein the fuel reformer comprises a housing, and the thermal insulation is positioned between the housing and the thermoelectric device.

6. The fuel reforming system of claim 1, wherein the plasma fuel reformer comprises a plasma generator and a reactor, and the thermoelectric device is positioned around a portion of the periphery of the reactor.

7. The fuel reforming system of claim 6, wherein the reactor comprises a reactor housing, and the thermoelectric device comprises a sleeve surrounding the reactor housing.

8. A method of generating electrical energy, the method comprising the steps of:
   operating a fuel reformer to reform a fuel to produce a reformate gas; and
   converting heat energy generated by operation of the fuel reformer to electrical energy, wherein the fuel reformer comprises a plasma fuel reformer, the operating step comprises operating the plasma fuel reformer to reform the fuel to produce the reformate gas, and the converting step comprises converting heat energy generated by operation of the plasma fuel reformer to electrical energy.

9. The method of claim 8, wherein the converting step comprises generating a temperature differential across a thermoelectric device to produce the electrical energy.

10. The method of claim 8, further comprising storing the electrical energy.

11. The method of claim 10, further comprising supplying the stored electrical energy to an electrical accessory of a vehicle.

12. The method of claim 10, further comprising supplying the stored electrical energy to a control system of a vehicle.

13. The method of claim 10, further comprising supplying the stored electrical energy to the fuel reformer.

14. A fuel reforming system, comprising:
   a plasma fuel reformer operable to reform a fuel to produce a reformate gas; and
   a thermoelectric device to convert heat energy generated by operation of the plasma fuel reformer to electrical energy.

15. The fuel reforming system of claim 14, wherein the reformate gas comprises a hydrogen-rich gas.

16. The fuel reforming system of claim 14, wherein the plasma fuel reformer comprises a plasma generator and a reactor, and the thermoelectric device is positioned around a portion of the periphery of the reactor.

17. The fuel reforming system of claim 16, further comprising thermal insulation positioned between the thermoelectric device and the reactor.

18. The fuel reforming system of claim 16, wherein the reactor comprises a reactor housing, and the thermoelectric device comprises a sleeve surrounding the reactor housing.

* * * * *

UNITED STATES PATENT AND TRADEMARK OFFICE
CERTIFICATE OF CORRECTION

PATENT NO. : 6,903,259 B2
DATED : June 7, 2005
INVENTOR(S) : Mehmet S. Ciray et al.

It is certified that error appears in the above-identified patent and that said Letters Patent is hereby corrected as shown below:

Column 5,
Line 20, change "convert" to -- converts --
Line 22, change ". wherein" to -- , wherein --

Signed and Sealed this

Twelfth Day of July, 2005

JON W. DUDAS
*Director of the United States Patent and Trademark Office*